(12) United States Patent
Buer

(10) Patent No.: US 6,348,881 B1
(45) Date of Patent: Feb. 19, 2002

(54) EFFICIENT HARDWARE IMPLEMENTATION OF A COMPRESSION ALGORITHM

(75) Inventor: Mark Leonard Buer, Gilbert, AZ (US)

(73) Assignee: Philips Electronics No. America Corp., New York, NY (US)

( * ) Notice: Subject to any disclaimer, the term of this patent is extended or adjusted under 35 U.S.C. 154(b) by 0 days.

(21) Appl. No.: 09/650,693

(22) Filed: Aug. 29, 2000

(51) Int. Cl.[7] .............................................. H03M 7/38
(52) U.S. Cl. ............................ 341/51; 341/50; 341/60; 341/59; 341/65; 341/87; 341/95; 341/106; 375/240
(58) Field of Search ............................. 341/51, 60, 50, 341/106, 65, 59, 87, 95

(56) References Cited

U.S. PATENT DOCUMENTS

| | | | |
|---|---|---|---|
| 4,558,302 A | * 12/1985 | Welch | 341/51 |
| 5,003,307 A | * 3/1991 | Whiting et al. | 341/51 |
| 5,151,697 A | * 9/1992 | Bunton | 341/51 |
| 5,339,076 A | 8/1994 | Jiang | |
| 5,455,576 A | 10/1995 | Clark, II et al. | |
| 5,469,161 A | 11/1995 | Bezek | |
| 5,532,693 A | 7/1996 | Winters et al. | |
| 5,532,694 A | 7/1996 | Mayers et al. | |
| 5,642,112 A | 6/1997 | Cooper | |
| 5,771,010 A | 6/1998 | Masenas | |
| 5,818,873 A | 10/1998 | Wall et al. | |
| 5,828,324 A | 10/1998 | Clark, II | |
| 5,877,714 A | 3/1999 | Satoh | |
| 5,936,560 A | 8/1999 | Higuchi | |

* cited by examiner

Primary Examiner—Michael Tokar
Assistant Examiner—Lam T. Mai
(74) Attorney, Agent, or Firm—Peter Zawilski

(57) ABSTRACT

Logic circuitry performs a matching algorithm function. A memory produces a match signal that indicates which memory cells contain data that matches input address data to the memory. A first logic AND function performs a logic AND between a current value of the match signal currently produced by the memory for the input address data with a prior value of the match signal produced by an immediately prior input address data. A buffer holds index data. A second logic AND function compares output of the first logic AND function with the index data. Output of the second logic AND function is returned to the buffer as new index data. Index logic generates an offset based on the index data stored in the buffer. A send byte function asserts a send byte signal when the match signal is zero and when the output of the second logic AND function is zero. A length counter is incremented for every cycle in which the send byte signal is not asserted.

18 Claims, 11 Drawing Sheets

EFFICIENT HARDWARE IMPLEMENTATION OF A COMPRESSION ALGORITHM

BACKGROUND

The present invention concerns data compression and decompression. More particularly, this invention relates to efficient hardware implementation of a compression algorithm.

Data compression can be used when storing or transmitting data in which there exists redundancy. Such compression allows the effective size of data to be reduced without information loss. The density of information is increased allowing for faster transmission times and requiring less storage resources.

The speed of a data compressor is important. Therefore, data compression algorithms are often implemented in hardware in order to reduce the time required to compress and decompress data.

Jacob Ziv and Abraham Lempel proposed two adaptive data compression schemes which construct a dictionary of codes representing unique strings of previous data symbols. These algorithms have been implemented in a number of variations. See for example, the implementations in U.S. Pat. No. 5,339,076, U.S. Pat. No. 5,455,576, U.S. Pat. No. 5,469,161, U.S. Pat. No. 532,693, U.S. Pat. No. 5,532,694, U.S. Pat. No. 642,112, U.S. Pat. No. 5,771,010, U.S. Pat. No. 5,818,873, U.S. Pat. No. 5,828,324, U.S. Pat. No. 5,877,714 and U.S. Pat. No. 5,936,560.

SUMMARY OF THE INVENTION

In accordance with the preferred embodiment of the present invention, logic circuitry performs a matching algorithm function. A memory produces a match signal that indicates which memory cells contain data that matches input address data to the memory. A first logic AND function performs a logic AND between a current value of the match signal currently produced by the memory for the input address data with a prior value of the match signal produced by an immediately prior input address data. A buffer holds index data. A second logic AND function compares output of the first logic AND function with the index data. Output of the second logic AND function is returned to the buffer as new index data. Index logic generates an offset based on the index data stored in the buffer. A send byte function asserts a send byte signal when the match signal is zero and when the output of the second logic AND function is zero. A length counter is incremented for every cycle in which the send byte signal is not asserted.

In a preferred embodiment of the present invention, an offset ready logic generates an offset ready signal when the output of the second logic AND function has only one bit set to logic one. Also, substitution logic substitutes all logic ones for the index logic as input to the second logic AND function on a cycle immediately after the send byte signal is asserted.

Also, in one embodiment of the present invention, the memory is implemented as a content addressable memory (CAM) in which data is not shifted. In this case, a first shift function performs a one bit shift of the prior value before the prior value is received by the first logic AND function. Also a second shift function performs a one bit shift of the index data before the index data is received by the second logic AND function. These two functions are not required when the memory is implemented using a first-in-first-out (FIFO) CAM.

The memory can be implemented using a FIFO CAM. For example, the CAM includes an address input for receiving CAM address signals. The FIFO CAM also includes a plurality of CAM cells tiled together.

Each CAM cell includes a cell address input for receiving the CAM address signals. A data input receives data to be stored in the CAM cell. Storage logic stores the data received at the data input. A data output presents as output the data stored in the storage logic. Match logic compares the data stored in the CAM cell with the CAM address signals. The match logic produces a match signal that indicates when the data stored in the CAM cell matches the CAM address signals. The CAM cells are tiled together by connecting the data output for one CAM cell to the data input for another CAM cell.

In one preferred embodiment, the storage units are implemented using a plurality of flip-flops. The match logic includes a plurality of logic XNOR gates and a logic NAND gate. Each XNOR gate receives as input a bit of the data stored in the CAM cell, and a bit of the CAM address signals. The logic NAND gate performs a logic NAND function on output from all of the plurality of logic XNOR gates. Also, the CAM cell can additionally include a validity input for receiving a validity bit that indicates whether the data to be stored in the CAM cell is valid. The validity bit is stored in the CAM cell and is presented as output along with the associated data.

The present inventions allows for an efficient hardware implementation of a loss-less compression algorithm that is compatible with the ANSI X3.241-1994 specification (known as Stacker LZS™)

DESCRIPTION OF THE PREFERRED EMBODIMENT

Figure 1:
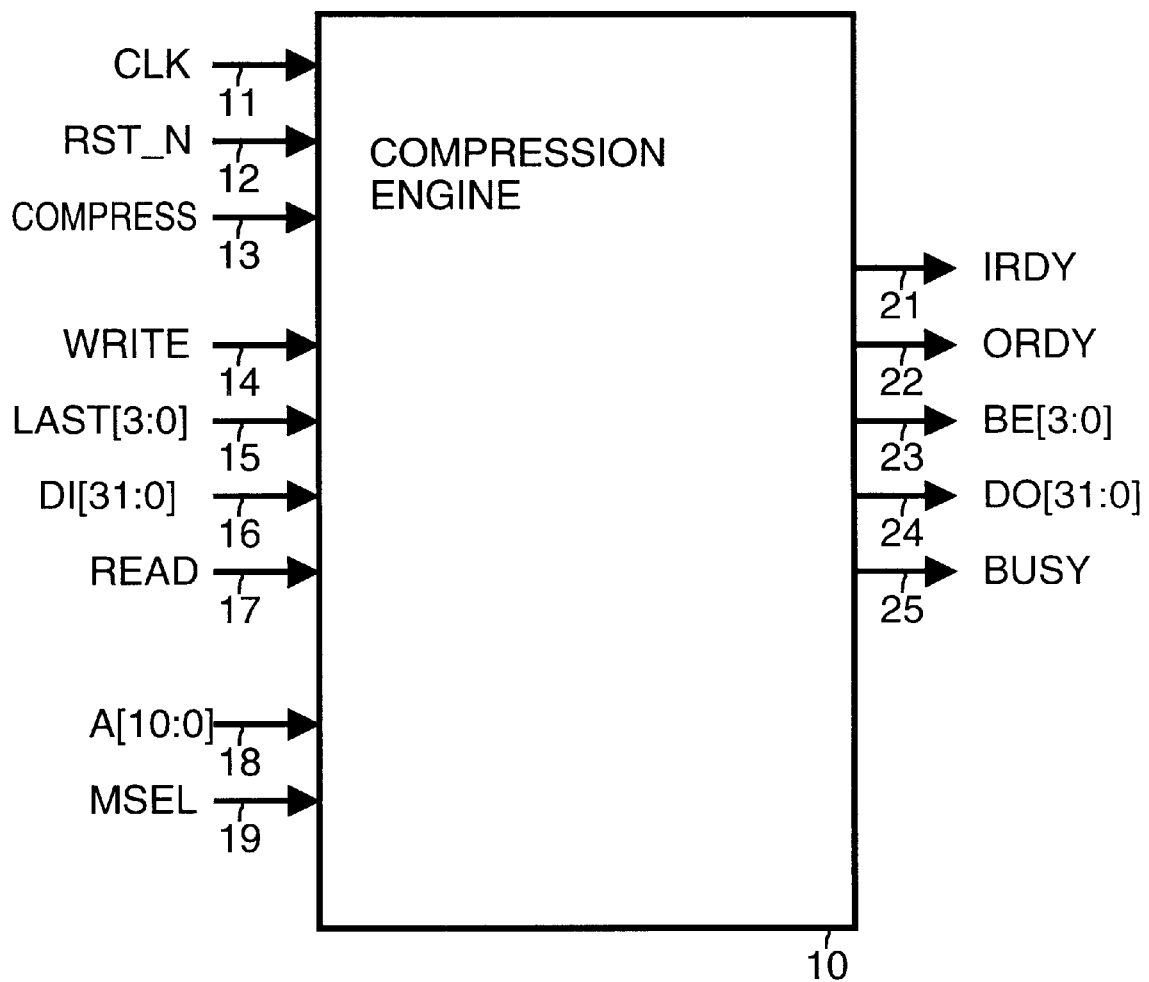
FIG. 1 is a block interface for a compression engine in accordance with a preferred embodiment of the present invention.

FIG. 1 is a block interface for a compression engine 10. The interface includes a one bit clock (CLK) input 11, a one bit reset (RST_N) input 12, a one bit compress input 13, a one bit write input 14, a four bit last (LAST[3:0]) input 15, a thirty-two bit data input (DI) 16, a one bit read input 17, a ten-bit address (A) input 18, a one bit match select (MSEL) input 10, a one bit input ready (IRDY) output 21, a one bit output ready (ORDY) output 22, a four bit (BE) output 23, a thirty-two bit data output (DO) 24 and a one-bit busy output 25.

Compression engine 10 is reset through reset (RST_N) input 12 to clear the history information from frame to frame. The last word of data is signaled (per byte) through control signals four bit last (LAST[3:0]) input 15. The output from compression engine 10 will continue to process and deliver data until the BUSY signal on one-bit busy output 25 is negated.

Compression engine 10 is a self-throttled compression engine capable of compressing or decompressing a byte of data (8 bits) per clock cycle.

Figure 2:
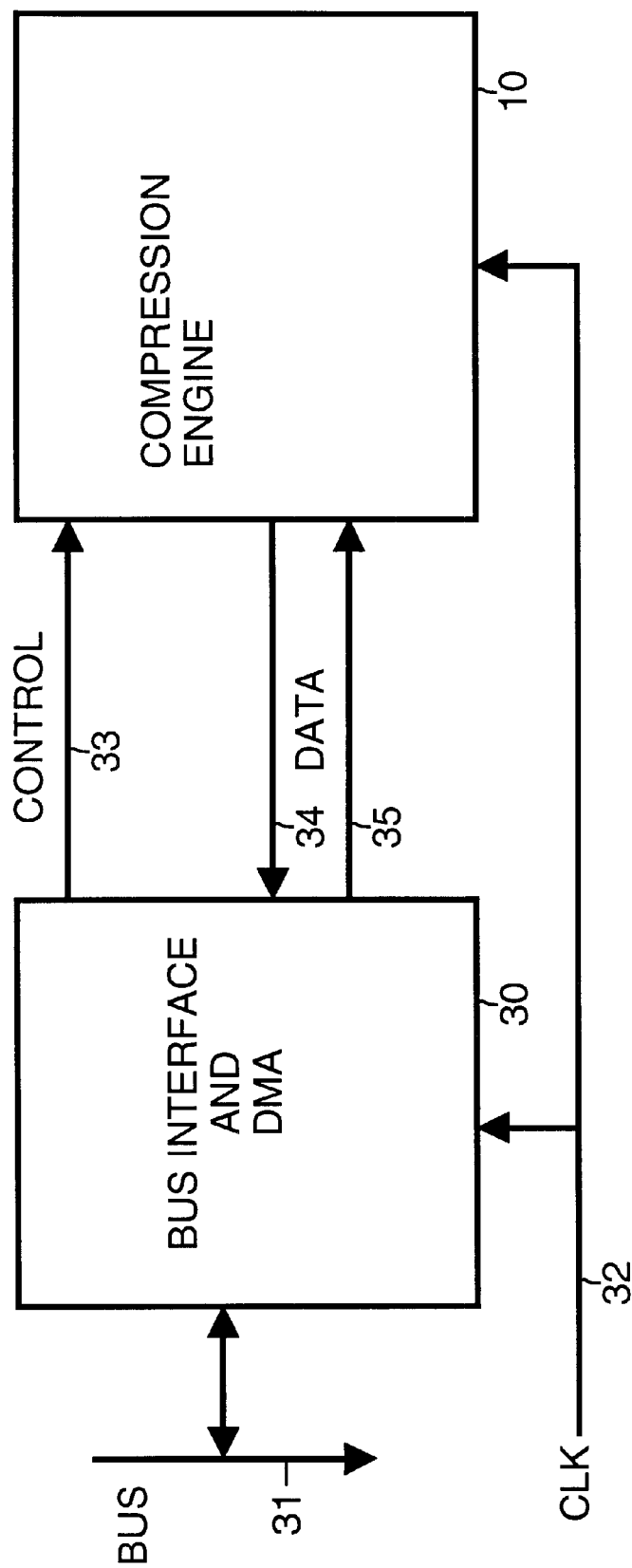
FIG. 2 shows implementation of a bus interface for the compression engine shown in FIG. 1 in accordance with a preferred embodiment of the present invention.

In the preferred embodiment, compression engine 10 utilizes a simple synchronous interface 30 to a bus 31 for input and output of compressed and decompressed data. This is shown in FIG. 2. Compression engine 10 throttles the input of data 35 and the output of data 34 through control signals 33. Compression engine 10 processes data a byte per clock signal 32. A clock signal 32 is used to synchronize timing of bus interface 30 and compression engine 10.

Compression engine 10 implements a loss-less compression algorithm that is compatible with the ANSI X3.241-1994 specification (known as Stacker LZS™) for frames less than or equal to 2048 bytes. The compression of the binary data stream is accomplished by finding repetitive patterns in the data. Compression engine 10 is an improved implementation in that compression engine 10 does not use a sliding window for data since an entire packet is contained in the history table.

In an alternative preferred embodiment, compression engine 10 uses a sliding window for the implementation of ANSI X3.241-1994. However, this embodiment requires a different architecture for implementation of the compression algorithm. A content addressable memory (CAM) component of compression engine 10 must operate as a first-in-first-out memory (FIFO) where each byte in the CAM gets shifted down as it is loaded into the CAM block.

Compressed data is represented by data and string tokens. The data tokens are used to represent actual data byte values. The string tokens are used to designate repetitive patterns in the packet. The data token is encoded as a "0" followed by the 8 bits of actual data.

The string token consists of "11" followed by a 7 bit offset into the history buffer (within the last 2048 bytes of data) and the length of the string pattern. Alternatively, the string token consists of "10" followed by an 11 bit offset into the history buffer (within the last 2048 bytes of data) and the length of the string pattern. The length of the string pattern is performed in blocks of 15 bytes, thus a string length of '1111' indicates a string pattern having a length of 15 bytes of data, a string length of '11111111' indicates a string pattern having a length of 30 bytes of data and a string length of '111111110111' indicates a string pattern having a length of 37 bytes of data.

The string token is built based on the size of the offset and the size of the length fields. Since each data token requires one extra bit, the data may expand when operated on by the compression algorithm. The maximum expansion ration is 9/8 or 12.5% expansion. The maximum compression ratio is limited by the requirement to output at least four bits for every 15 bytes of data (30/1 for infinite long pattern of the same character). The end marker is constructed as a special string token with an offset of 0×0 (extra zeros are added after the end marker to byte align the data).

In one embodiment of the present invention, a pipelined implementation is used to implement the ANSI X3.241-1994 specification. The pipeline implementation allows for minimum storage of data and retains the highest throughput performance. A sliding window is used for the history buffer in order for the algorithm to compress packets larger than the history buffer. In this embodiment, a two kilobyte sliding window is employed.

A redundant string is found by comparing the current byte with the sliding window of history information. The history buffer contains the last 2048 bytes of processed information (every byte that is processed appears in the history buffer after the comparison even when a match occurs). If the byte does not match any location in the history buffer, then the byte is passed to the output as a data token. If a match occurs, then no byte is passed to the output and the next byte is processed until no more matches are found (the matches must be adjacent). Once no more matches are found, the offset of the match within the data pattern and the length of the matching string is passed to the output as a string token.

A content addressable memory (CAM) is an ideal device for storage of the history buffer data. For optimal performance when implementing a sliding window architecture, the CAM must have the characteristics of a FIFO such that as each byte is loaded, the entire CAM is shifted down in a single clock period.

Figure 3:
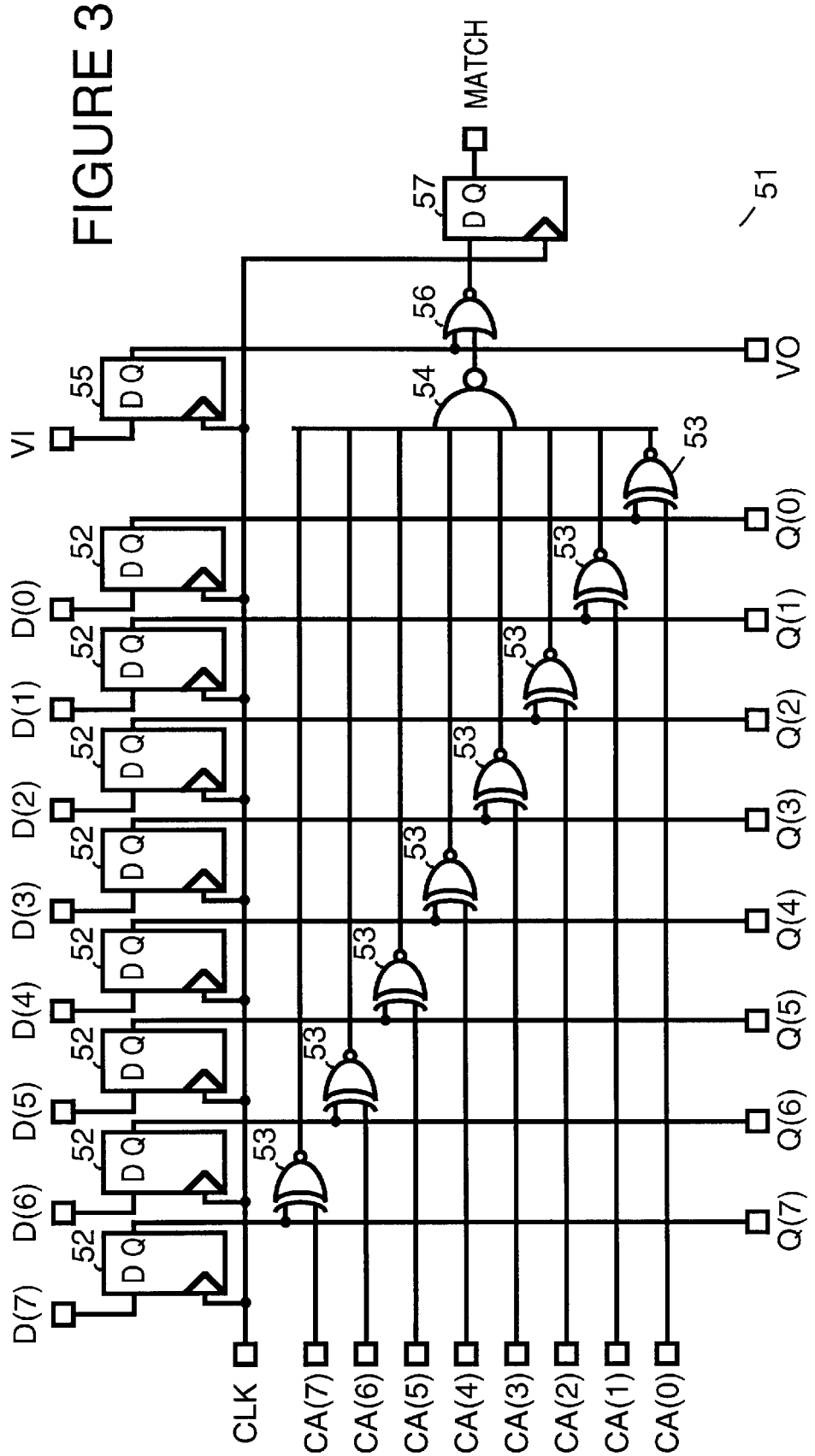
FIG. 3 shows the structure for a CAM cell in accordance with a preferred embodiment of the present invention.

FIG. 3 shows the structure for a CAM cell 51. CAM cell 51 contains eight bits of register storage implemented by flip flops (FF) 52. The register storage receives input D[7:0] and outputs Q[7:0]. A comparator implemented using logic XNOR gates 53 and a logic NAND gate 54 indicates whether there is a match between Q[7:0] and the CAM address CA[7:0]. A valid input bit (VI) is stored in a flip-flop 55 to produce a valid output bit (VO) that indicates when the location specified by D[7:0] contains valid information. Logic NOR gate 56 produces an output (MATCH) signal which is registered through flip-flop 57 to enhance the speed at which CAM cell 51 can operate.

Figure 4:
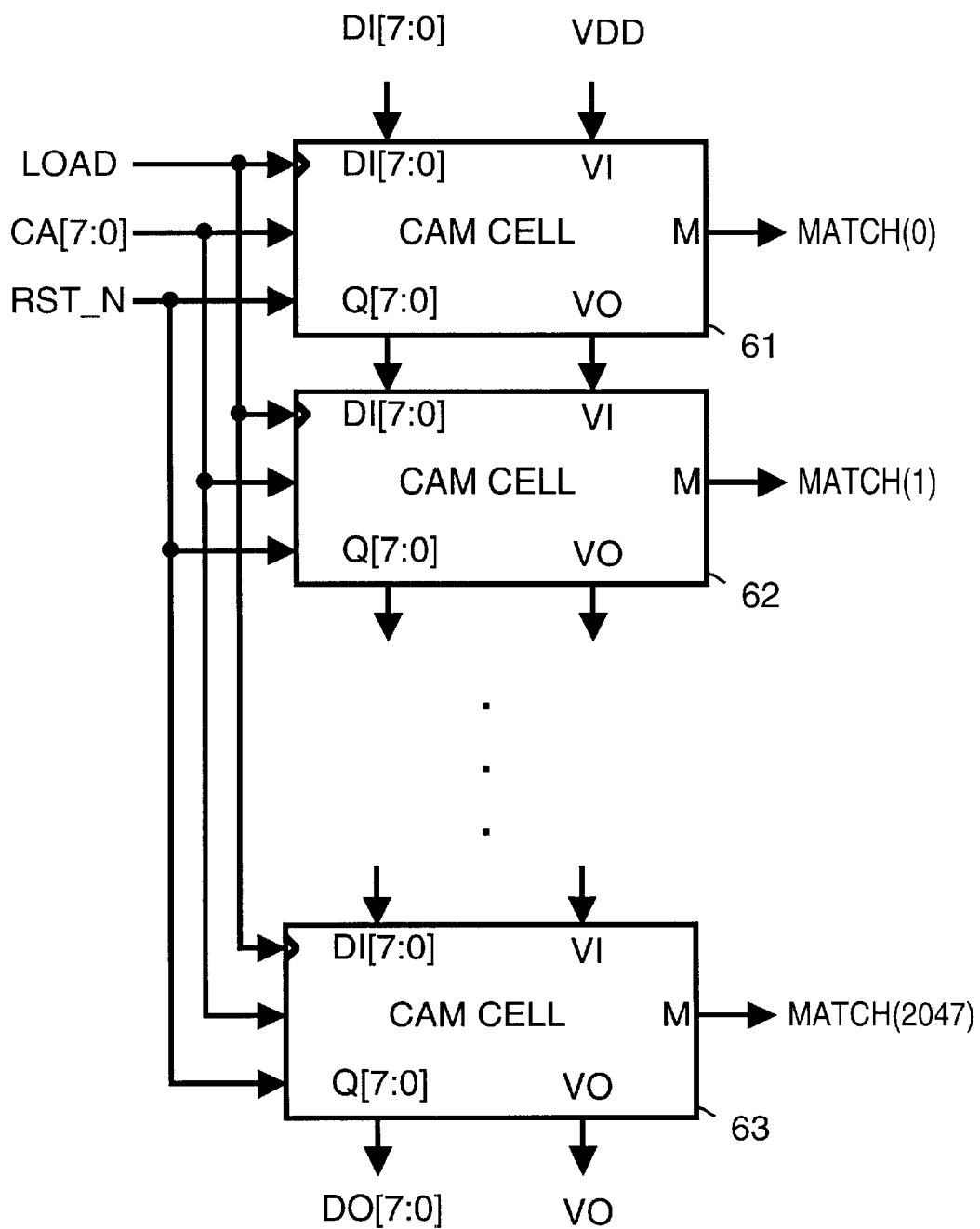
FIG. 4 shows CAM cells tiled together in accordance with a preferred embodiment of the present invention.

As illustrated by FIG. 4, CAM cells are tiled together to construct the entire CAM block which serves as a history buffer. This is represented in FIG. 4 by CAM cell 61, a CAM cell 62 and a CAM cell 63 tiled together as shown. The LOAD and CAM address CA [7:0] signals are common across the entire array of tiled CAM cells. The reset (RST_N) signal is used to clear the entire array (valid bits) in a single clock by flushing the history buffer. Since the history buffer is 2048 bytes long, there are 2048 CAM cells.

As can be seen from FIG. 4, a byte of data DI[7:0] enters CAM cell 61 along with a validity in (VI) signal that indicates whether the byte of data is valid. In successive clock cycles the data byte clocks through all 2048 CAM cells.

Figure 5:
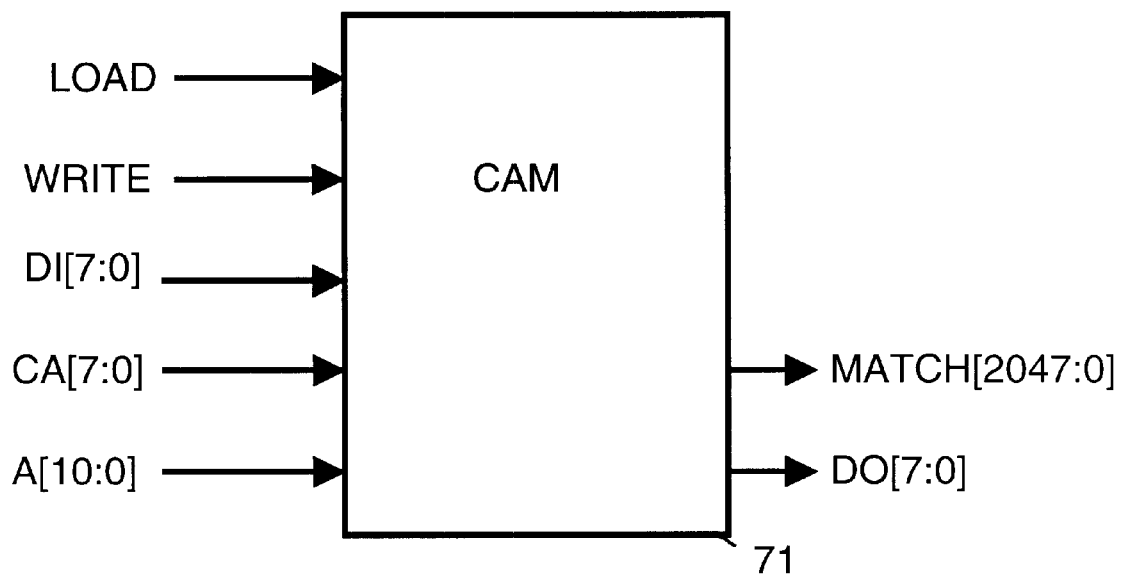
FIG. 5 is a block diagram that shows the input/output interface to a CAM in accordance with a preferred embodiment of the present invention.

FIG. 5 is a block diagram that shows the input/output interface to a CAM 71. Input to CAM 71 is a LOAD signal, a Write signal, a data in byte DI [7:0], a CAM address CA [7:0], and an eleven bit address A[10:0]. CAM 71 produces a one byte data out DO [7:0] and an indication of a match (MATCH [2047:0]) for each of the 2048 CAM cells.

The eleven bit address A[10:0] provides direct read/write access to each CAM register (cell). This is provided for test purposes and allows the same storage elements to be used for the decompression of the data.

Since the comparison logic and the subsequent string matching logic are pipelined, the output data that is presented when a match is not found needs to follow the pipeline. The direct memory access to the CAM can be used to read out the correct byte in the data stream by setting the read address to the depth of the pipeline without the requirement for extra buffering.

The size of CAM 71 is considerable. Implemented as shown in FIGS. 3, 4 and 5, the gate count for CAM 71 is approximately 212,000 gates. The size can be considerably reduced by constructing a custom lay out cell to implement CAM 71 (much like a compiled memory). This also improves the speed at which CAM 71 is able to operate.

The registered match values (as represented by flip-flop 57 in FIG. 3) delays the output data within the pipeline by a clock period. This may be removed in slower speed applications to reduce the gate count of the implementation.

Figure 6:
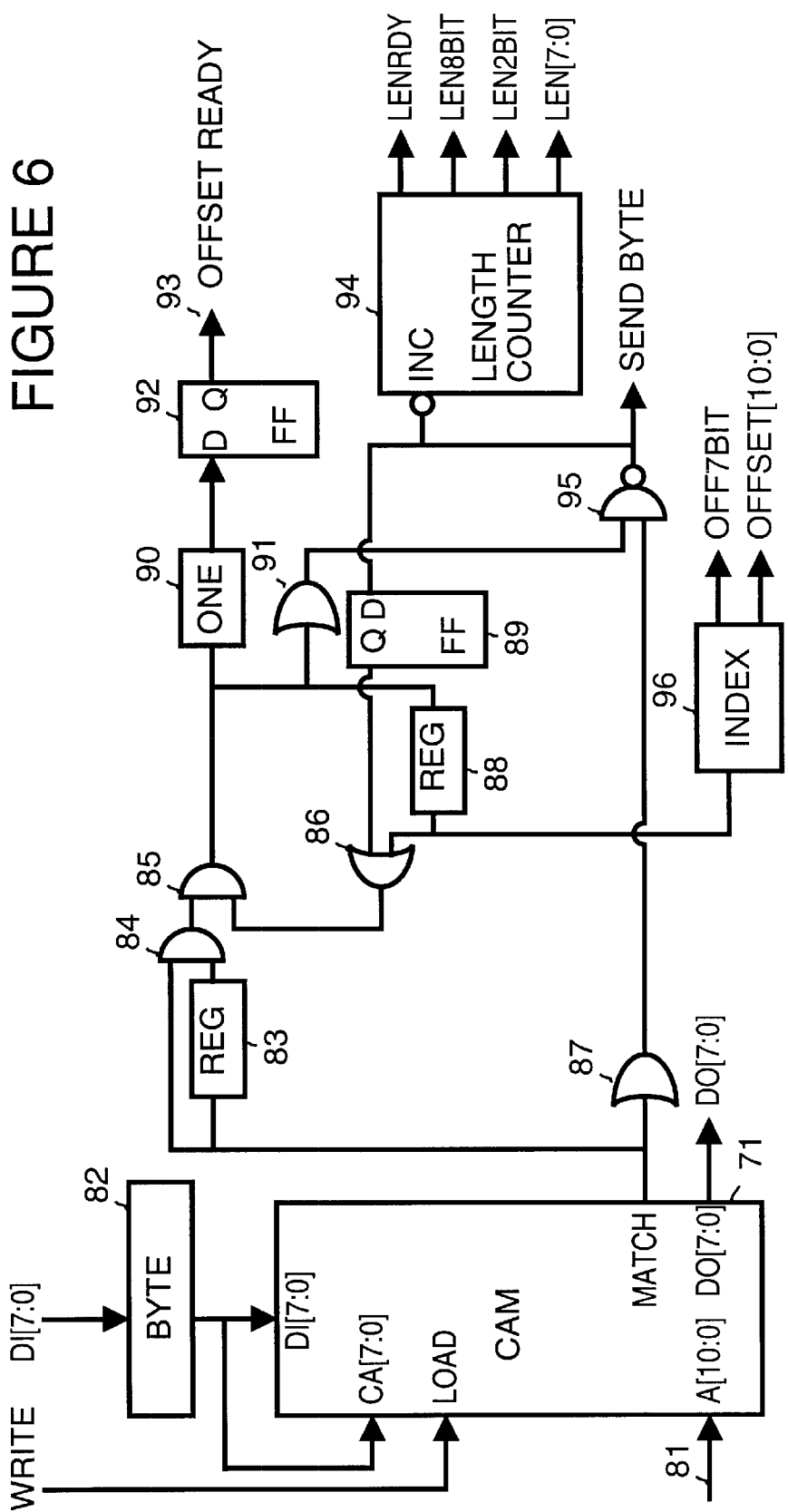
FIG. 6 shows a hardware implementation of a compression matching algorithm in accordance with a preferred embodiment of the present invention.

FIG. 6 shows a hardware implementation of a compression matching algorithm. A one byte latch (BYTE) 82 holds incoming data to be inserted into CAM 71. A logic OR gate 87 performs a logic OR function on the 2048 MATCH bits to produce a single bit to indicate whether any match has occurred. A value of "1" is placed as an input 81 to the address A[10:0] of CAM 71.

A register 83 holds the 2048-bit match value for the previous clock cycle. A logic AND gates 84 performs a bit by bit logic AND between the 2048-bit match value for the previous clock cycle with the 2048-bit match value for the present clock cycle to produce a 2048 bit output. Logic AND gates 85 performs a bit by bit logic AND of the 2048-bit output value logic AND gate 84 with the 2048-bit out of logic OR gates 86. The output of logic AND gates 85 is stored in register 88. Logic OR gates 86 performs a logic OR of the values stored in register 88 with the one bit value stored in a flip-flop 89 to produce a 2048 bit output. When the one bit value stored in flip-flop 89 is logic 1, logic OR gates 86 produces an output signal of 2048 logic ones.

A logic OR gate 91 performs a logic OR on the 2048 bit output of logic AND gates 85. A logic NAND gate 95 performs a logic NAND function between the one-bit output of logic OR gate 87 and the one-bit output of logic OR gate 91 to produce a SEND BYTE signal.

The matching algorithm looks for "adjacent" matches to determine the redundant string. The formation of the string is not saved per se as a string. Only the adjacent matches are tracked as the string found in the history buffer. The adjacent matches are constructed by looking for transitions from the previous match vector to the current state of the match vector.

Since the data moves through CAM 71 in a FIFO type fashion, the offset, which is output by an index block 96, can be determined directly from the last adjacent match that is found. Therefore, the offset is known as soon as one and only one adjacent match is detected. A "one" function 90 detects when one and only one adjacent match is detected and stores an indication in flip-flop 92. Flip-flop 92 generates an offset ready (OFFRDY) signal 93.

In this way the offset from index 96 can be delivered to the data stream prior to the entire string match being found. The offset is stored in register (REG) 88. The delivery of the offset early enhances the overall performance of the block since the offset is usually determined in advance of the string match completing (especially for short strings).

The offset may not resolve for a particular string token (two matching strings in the history buffer). Since the decompression does not care which pattern is referenced, the string token may output either offset. The value of the offset token is determined by index function 96 that operates as a priority encoder. Index 96 produces an eleven bit offset ([10:0] and an Off7bit signal that indicates when only seven bits (i.e., a seven bit offset) of the eleven bit offset are to be used.

Length counter 94 performs an increment based on the signal from logic NAND gate 95. The eight bit length (LEN[7:0]) output by length counter 94 is determined by the number of consecutive matching bytes that are found. The length of the string is normally delivered to an output buffer in increments of four bits. The delivery of the encoded length four bits at a time ensures that the length can be of infinite size. The performance is also enhanced since the length of the string (all but the final 4 bits) can be delivered to the output buffer as the string match is incrementing. The length ready (LENRDY) signal indicates when a length is ready. The LEN8BIT output indicates length is 8-bit length. The LEN2BIT output indicates the length is 2 bits. The default is four bits. The reason for use of 8-bit lengths is described below.

The offset cannot be guaranteed to resolve to one and only one string match until half way through CAM 71 (1024 bytes). Length counter 94 must therefore be able to hold a count up to 1024 until the offset is resolved (OFFRDY is asserted). Once the offset is resolved the length function will output 8 bits at a time until it decrements the stored length to less than a count of 16. Once the length is less than 16 and the offset is resolved, then the length function will output 4 bits at a time until the end of the string match.

Figure 7:
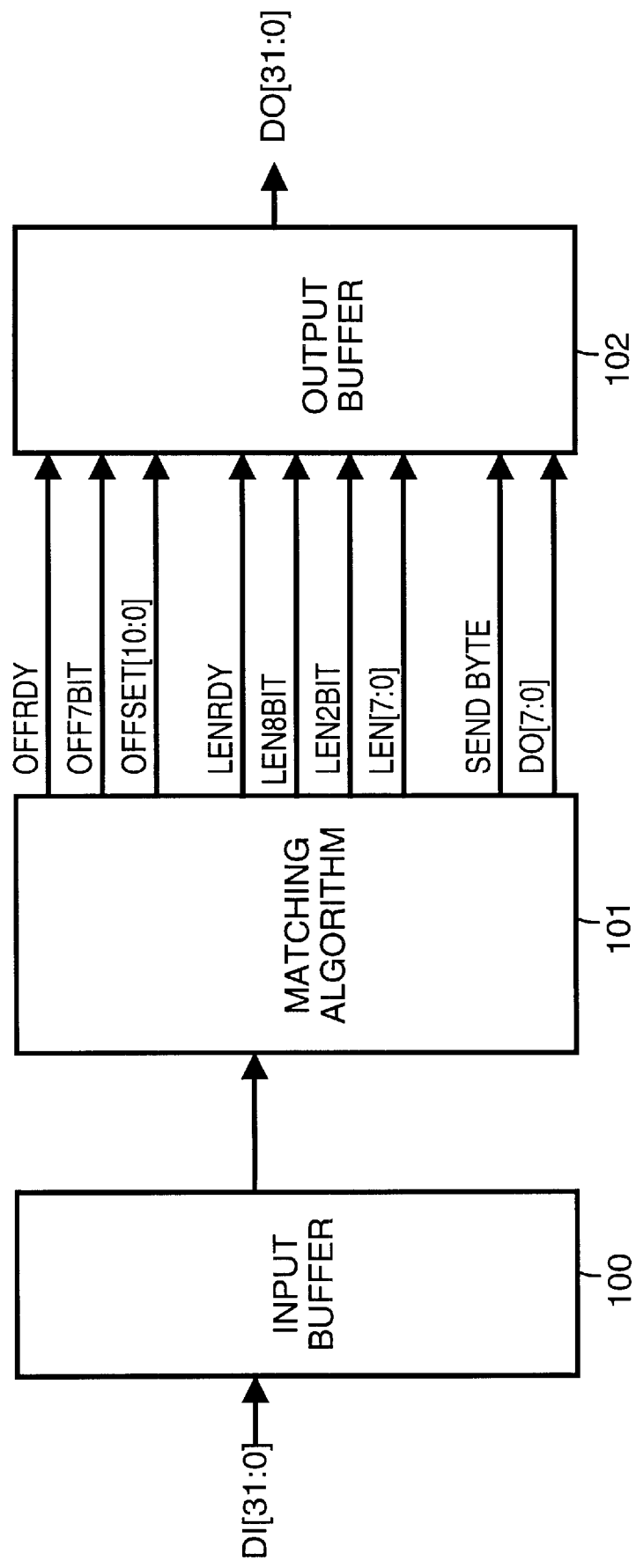
FIG. 7 illustrates compression data flow through the compression matching algorithm shown in FIG. 6 in accordance with a preferred embodiment of the present invention.

FIG. 7 shows compression data flow through matching algorithm 101 (the details of which are shown in FIG. 6). Thirty-two bit data input DI [31:0] is buffered by an input buffer 100. Input buffer 100 transfers data eight bits at a time to byte latch 82 (shown in FIG. 6). The individual bytes are extracted from input buffer 100 and pipelined into the data path of matching algorithm 101.

Thirty-two bit data output is buffered by an output buffer 102. Output buffer 102 is used to gather the compressed data stream information (data tokens and string tokens) and align them to a word boundary.

The output OFFRDY is driven active at the end of the string (if not already active) to force the output of length. The LENRDY output is also asserted at the end of a string to ensure that the last bits of the encoded length are read.

The length may take a number of clocks to transfer to output buffer 102 due to the fact that the offset may not resolve until the end of the matching string. The effect is minimized by increasing the bit width of the length output to the output buffer. At 8 bit width (rather than 4 bit width) the worst case is that 1024 bytes of data have been collected and the string is terminated at that point. It will take one clock to transfer the offset and 35 clocks ((1024/15) * 4/8) to completely transfer the encoded length from matching algorithm 101 to output buffer 102.

The first two bytes of every string is pipelined to output buffer 102 through CAM 71 since the source pattern requires at least two bytes for a string match. A byte is sent to output buffer from DO [7:0] lines of CAM 71 each time the SEND BYTE signal goes active, except for the first byte on a zero to one transition of SEND BYTE. This indicates that the end of string is reached and the string token is finished.

Input buffer 100 transfers data eight bits at a time to byte latch 82 (shown in FIG. 6). The individual bytes are extracted from input buffer 100 and pipelined into the data path of matching algorithm 101. The output buffer (also 32 bits) is used to gather the compressed data stream information (data tokens and string tokens) and align them to a word boundary.

Decompression of compressed data is a much simpler task than compression. The CAM 71 can be reused for the decompression of the data. Input buffer 100 is utilized to maintain a byte aligned data stream while striping off the data and string tokens.

Figure 8:
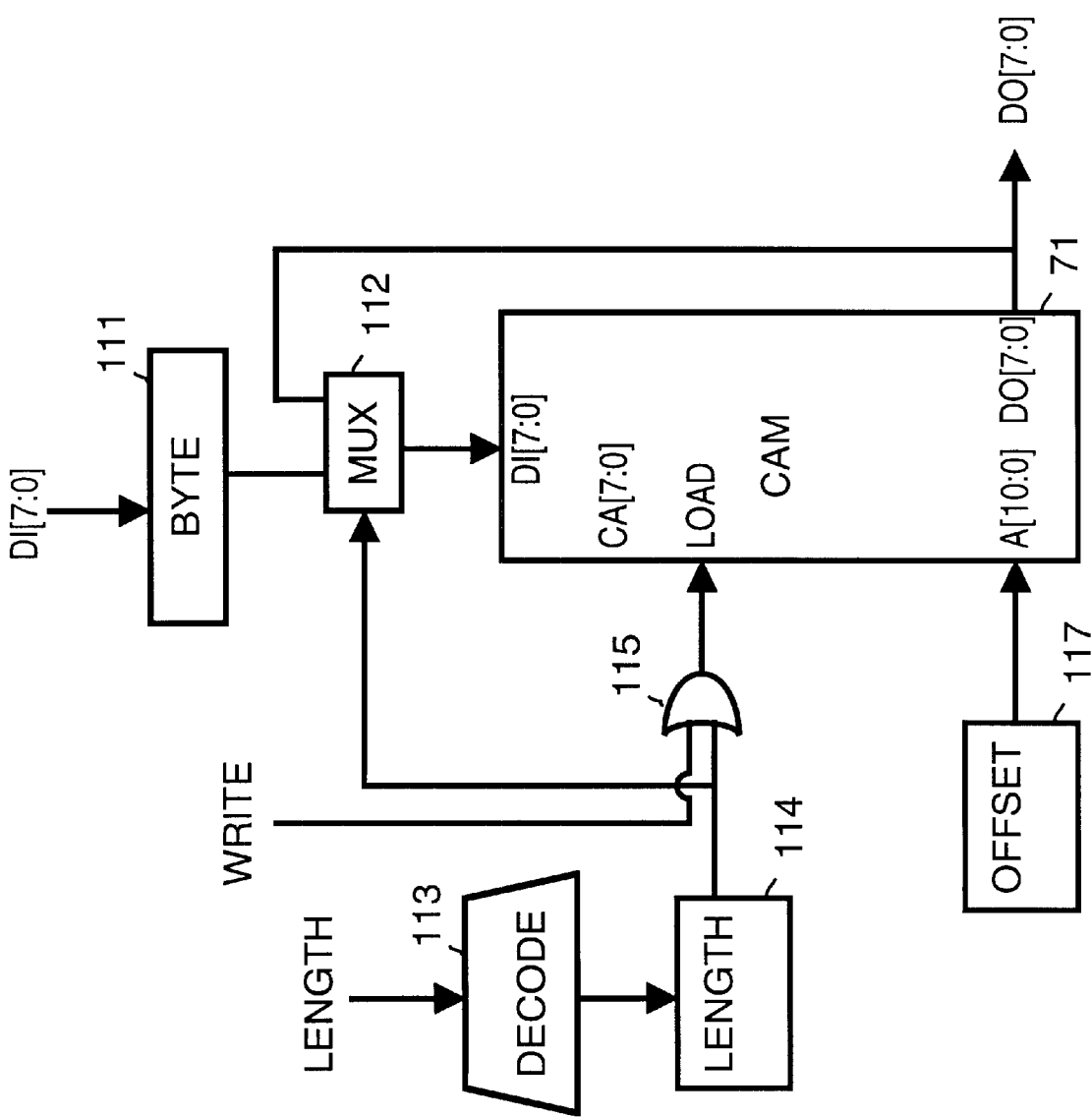
FIG. 8 shows decompression data flow in accordance with a preferred embodiment of the present invention.

FIG. 8 shows decompression data flow. The string tokens are parsed to extract an offset field 117 and length fields.

Offset field 117 is extracted as an entire field while length 114 is extracted four bits at a time. Each length field is decoded by a decode 113 and result loaded into a length counter 114 that is used to determine the length of the string in multiples of 4 bits. The offset value (minus one) is used to address the CAM to extract the proper byte. Each decompressed byte (DO [7:0]) is delivered to output buffer 102 (shown in FIG. 7) and placed in CAM 71 for subsequent use as history information. A multiplexer (MUX) 112 selects either byte 111 or DO [7:0] based on whether length counter 114 indicates that length is zero (i.e., a data byte is being processed) or length is greater than zero (i.e., a string token is being processed).

The length in length counter 114 then decrements for each byte that is processed as part of the string until zero is reached. Length counter 114 has a one-bit output value that indicates when the length is greater than 0. A logic OR gate 115 performs a logic OR on this value with a WRITE signal before forwarding it to the LOAD input of CAM 71.

For example, before compression, a data string is defined as per ANSI X3.241-1994 as the following 16 byte character string "A B A A A A A A C A B A B A B A". The hex string equivalent is "41 42 41 41 41 41 41 41 43 41 42 41 42 41 42 41".

The resulting compressed string is generated with a pipeline delay of 2 cycles as "20 90 88 38 1C 21 E2 5C 15 80".

Figure 9:
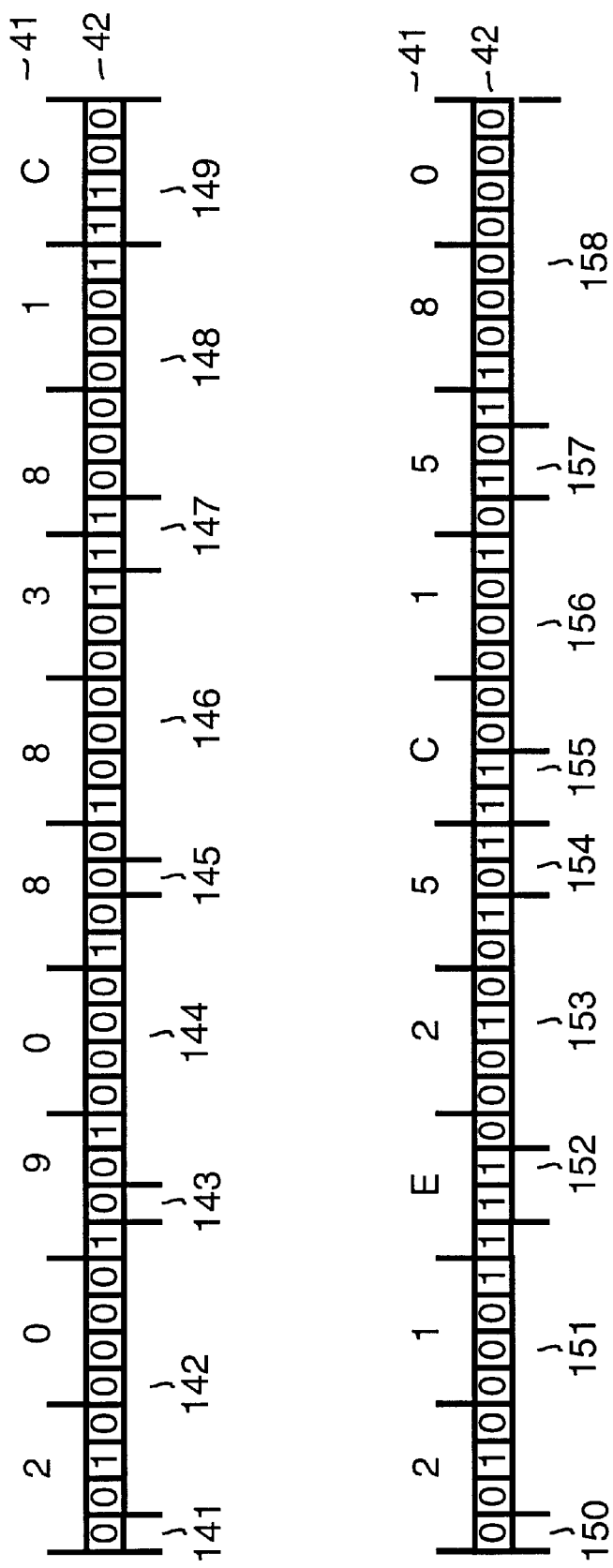
FIG. 9 gives an example of compressed data in accordance with a preferred embodiment of the present invention.

FIG. 9 shows the compressed value. Top row 41 shows the hex values. Row 42 shows the binary bit encoding of the hex value.

When decompressing the compressed data, the input stream is parsed to strip the bytes and string tokens out of the stream. Each data token is converted to a byte by removing the leading zero. The byte is then provided directly to the output and loaded into the CAM. The string tokens are decoded and used to expand the data from the history buffer (CAM contents).

The expansion of the data is accomplished by applying the offset (minus one) as the address (A) to the CAM block. The resulting data out (DO) is then loaded into CAM 71 and presented as an output byte. The process is continued until the length of the string token has been decremented to zero.

The offset does not change as the length is decremented when extracting the string from history buffer (CAM) 71. Each string token that is parsed from the compressed data is processed until the end marker is reached.

For example, when decompressing the value set out in FIG. 9, bit 141 is a "0" indicating that the next eight bits are uncompressed data. Next eight bits 142 are a data value "41" which is placed in CAM 71 and utilized as one byte of data out. As a result, CAM 71 is storing the following hex value "41" (starting with location 0 in CAM 71).

A bit 143 is a "0" indicating that the next eight bits are uncompressed data. Next eight bits 144 are a data value "42" which is placed in CAM 71 and utilized as one byte of data out. As a result, CAM 71 is storing the following hex values "42 41" (starting with location 0 in CAM 71).

A bit 145 is a "0" indicating that the next eight bits are uncompressed data. Next eight bits 146 are a data value "41" which is placed in CAM 71 and utilized as one byte of data out. As a result, CAM 71 is storing the following hex values "41 42 41" (starting with location 0 in CAM 71).

A two-bit string 147 indicates that a string offset and length follow. Since the value of the two bits are "11" this indicates that the offset is described in seven bits (i.e., has a value less than or equal to 127). If the offset had been greater than 127, eleven bits would have been used and the value of two-bit string 147 would have been "10".

A seven bit offset 148 indicates the offset is equal to "1". This offset less 1 (OFFSET−1) is placed on the address (A[10:0]) input of CAM 71. A four bit length 149 is divided into two two-bit sections. The first two bit section has a bit value of "11" which equals 3. The second two bit section has a bit value of "00" which equals 0. The total length of the string is therefore 2+3+0=5.

In the first clock cycle, the address of 0 (OFFSET−1) results in the value "41" being output from CAM 71. This value is utilized as the one byte of data out (DO[7:0]) and placed back in CAM 71. As a result, CAM 71 is storing the following hex values "41 41 42 41". The length is decremented to 4.

In the next clock cycle, the address of 0 (OFFSET−1) results in the value "41" being output from CAM 71. This value is utilized as the one byte of data out (DO[7:0]) and placed back in CAM 71. As a result, CAM 71 is storing the following hex values "41 41 41 42 41". The length is decremented to 3.

In the next clock cycle, the address of 0 (OFFSET−1) results in the value "41" being output from CAM 71. This value is utilized as the one byte of data out (DO[7:0]) and placed back in CAM 71. As a result, CAM 71 is storing the following hex values "41 41 41 41 42 41". The length is decremented to 2.

In the next clock cycle, the address of 0 (OFFSET−1) results in the value "41" being output from CAM 71. This value is utilized as the one byte of data out (DO[7:0]) and placed back in CAM 71. As a result, CAM 71 is storing the following hex values "41 41 41 41 41 42 41". The length is decremented to 1.

In the next clock cycle, the address of 0 (OFFSET−1) results in the value "41" being output from CAM 71. This value is utilized as the one byte of data out (DO[7:0]) and placed back in CAM 71. As a result, CAM 71 is storing the following hex values "41 41 41 41 41 41 42 41". The length is decremented to 0.

A bit 150 is a "0" indicating that the next eight bits are uncompressed data. Next eight bits 151 are a data value "43" which is placed in CAM 71 and utilized as one byte of data out. As a result, CAM 71 is storing the following hex values "43 41 41 41 41 41 41 42 41".

A two-bit string 152 indicates that a string offset and length follow. Since the value of the two bits are "11" this indicates that the offset is described in seven bits (i.e., has a value less than or equal to 127).

A seven bit offset 153 indicates the offset is equal to "9". This offset less 1 (OFFSET−1) is placed on the address (A[10:0]) input of CAM 71. A two bit length 154 has a bit value of "01" which equals 1. The total length of the string is therefore 2+1=3.

In the first clock cycle, the address of 8 (OFFSET−1) results in the value "41" being output from CAM 71. This value is utilized as the one byte of data out (DO[7:0]) and placed back in CAM 71. As a result, CAM 71 is storing the following hex values "41 43 41 41 41 41 41 41 42 41". The length is decremented to 2.

In the next clock cycle, the address of 8 (OFFSET−1) results in the value "42" being output from CAM 71. This value is utilized as the one byte of data out (DO[7:0]) and placed back in CAM 71. As a result, CAM 71 is storing the following hex values "42 41 43 41 41 41 41 41 41 42 41". The length is decremented to 1.

In the next clock cycle, the address of 8 (OFFSET−1) results in the value "41" being output from CAM 71. This value is utilized as the one byte of data out (DO[7:0]) and placed back in CAM 71. As a result, CAM 71 is storing the following hex values "41 42 41 43 41 41 41 41 41 41 42 41". The length is decremented to 0.

A two-bit string 155 indicates that a string offset and length follow. Since the value of the two bits are "11" this indicates that the offset is described in seven bits (i.e., has a value less than or equal to 127).

A seven bit offset 156 indicates the offset is equal to "2". This offset less 1 (OFFSET−1) is placed on the address (A[10:0]) input of CAM 71. A two bit length 157 has a bit value of "10" which equals 2. The total length of the string is therefore 2+2=4.

In the first clock cycle, the address of 1 (OFFSET−1) results in the value "42" being output from CAM 71. This value is utilized as the one byte of data out (DO[7:0]) and placed back in CAM 71. As a result, CAM 71 is storing the following hex values "42 41 42 41 43 41 41 41 41 41 42 41". The length is decremented to 3.

In the next clock cycle, the address of 1 (OFFSET−1) results in the value "41" being output from CAM 71. This value is utilized as the one byte of data out (DO[7:0]) and placed back in CAM 71. As a result, CAM 71 is storing the following hex values "41 42 41 42 41 43 41 4141 41 41 41 42 41". The length is decremented to 2.

In the next clock cycle, the address of 1 (OFFSET−1) results in the value "42" being output from CAM 71. This value is utilized as the one byte of data out (DO[7:0]) and placed back in CAM 71. As a result, CAM 71 is storing the following hex values "42 41 42 41 42 41 43 41 41 41 41 41 42 41". The length is decremented to 1.

In the next clock cycle, the address of 1 (OFFSET−1) results in the value "41" being output from CAM 71. This value is utilized as the one byte of data out (DO[7:0]) and placed back in CAM 71. As a result, CAM 71 is storing the following hex values "41 42 41 42 41 42 41 43 41 41 41 41 41 41 42 41". The length is decremented to 0.

An eight bit string 158 is an end marker indicating the end of the data stream.

The compression algorithm can be simplified to a non-windowed algorithm by restricting the packet size to be smaller than the history buffer (2048 bytes). By restricting the packet size the history buffer does not need to "slide" with the packet data to contain the last 2048 bytes of information.

A standard CAM structure is used to implement the algorithm since the data will never wrap around the history buffer. Because the data does not wrap around the history buffer (CAM), there is no need to keep track of start and end pointers for the history table. Additionally, there is no need to continue to shift the match output connections to ensure adjacency for the character comparison in the string matching.

There still is one disadvantage to utilizing a standard CAM structure even in a non-windowed environment. The offset has to be calculated based on the number of bytes held in the CAM (or the current accumulated string length in bytes) and the final index of the CHAR vector. The calculation is OFFSET=STRING LENGTH−INDEX+1.

The bit shift for the calculation of the string match (CHAR) must now be done external to the CAM. In architecture one, the bit shift was implicit since the CAM shifted the data as each byte was loaded.

Figure 10:
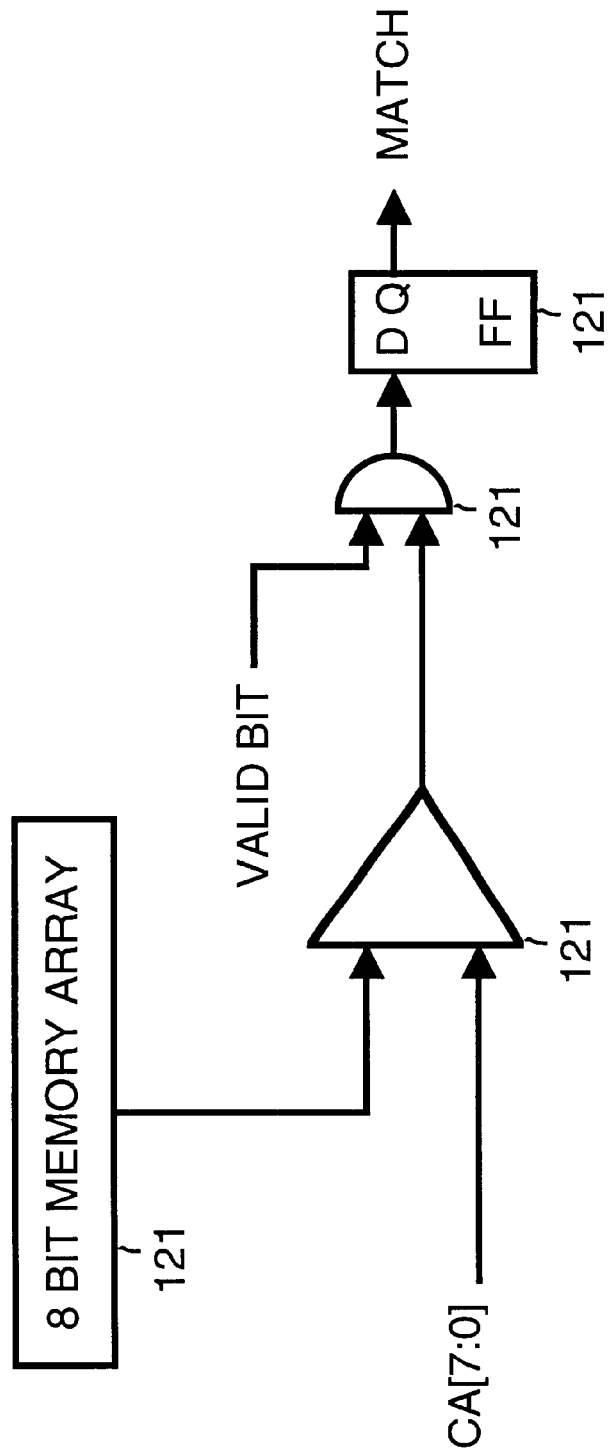
FIG. 10 shows the structure for a CAM cell in accordance with an alternative preferred embodiment of the present invention.

FIG. 10 shows an example structure for a CAM cell 51 for this alternative embodiment of the present invention. An eight-bit memory array 121 stores the value for the memory cell. A comparator 121 compares this with the CAM address CA[7:0]. A logic NAND gate performs a logic AND on the output of comparator 121 and a valid bit. The result is stored in a flip-flop 121. The output of flip-flop 121 is a one-bit match signal which indicates whether there is a match of valid data from CA [7:0] to data stored in eight-bit memory array 121.

The standard CAM cell shown in FIG. 10 does not chain data together. It is simply a memory array with each element being compared to the CAM address (CA). The cells are tiled together and a standard memory read/write access is available. Typically the CAM compare is an exclusive access to a read or a write to the CAM memory array and valid bit. The MATCH output may or may not be registered inside of the CAM. The registering of the MATCH output is simply a pipeline delay and timing enhancement.

Figure 11:
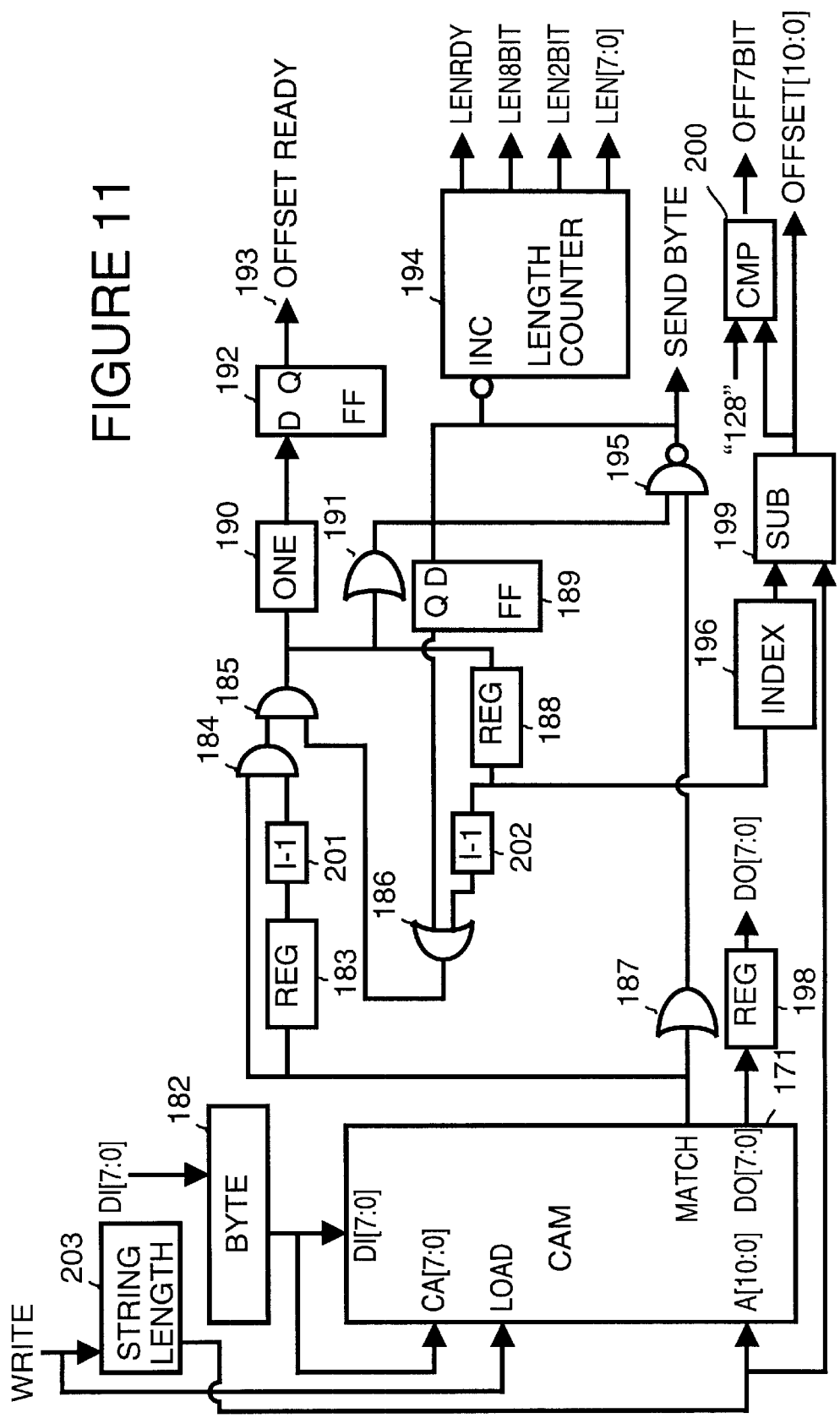
FIG. 11 shows a hardware implementation of a compression matching algorithm in accordance with an alternative preferred embodiment of the present invention.

FIG. 11 shows a hardware implementation of a compression matching algorithm for the alternative preferred embodiment. A one byte latch (BYTE) 182 holds incoming data to be inserted into a CAM 171. A logic OR gate 187 performs a logic OR functions on the 2048 MATCH bits to produce a single bit to indicate whether any match has occurred.

A register 183 holds the 2048-bit match value for the previous clock cycle. A logic AND gates 184 performs a bit by bit logic AND between the 2048-bit match value for the previous clock cycle with the 2048-bit match value for the present clock cycle to produce a 2048 bit output. An "I−1" function 201 performs a one bit shift of the stored match value in register 183 (no gates required, simply a wiring shift). Logic AND gates 185 performs a bit by bit logic AND of the 2048-bit output value logic AND gate 184 with the 2048-bit out of logic OR gates 186. The output of logic AND gates 185 is stored in register 188. Logic OR gates 186 performs a logic OR of the values stored in register 188 with the one bit value stored in a flip-flop 189 to produce a 2048 bit output. An "I−1" function 202 performs a one bit shift of the stored match value in register 188 before it is forwarded to logic OR gates 186.

A logic OR gate 191 performs a logic OR on the 2048 bit output of logic AND gates 185. A logic NAND gate 195 performs a logic NAND function between the one-bit output of logic OR gate 187 and the one-bit output of logic OR gate 191 to produce a SEND BYTE signal.

The matching algorithm looks for "adjacent" matches to determine the redundant string. The formation of the string is not saved per se as a string. Only the adjacent matches are tracked as the string found in the history buffer. The adjacent matches are constructed by looking for transitions from the previous match vector to the current state of the match vector.

One function 190 detects when one and only one adjacent match is detected and stores an indication in flip-flop 192. Flip-flop 192 generates an OFFRDY signal 193.

In this way the offset from an index 196 can be delivered to the data stream prior to the entire string match being found. The delivery of the offset early enhances the overall performance of the block since the offset is usually determined in advance of the string match completing (especially for short strings).

Length counter 194 performs an increment based on the signal from logic NAND gate 195. The eight bit length (LEN[7:0]) output by length counter 194 is determined by the number of consecutive matching bytes that are found. The length of the string can be delivered to an output buffer in increments of four bits. The delivery of the encoded length four bits at a time ensures that the length can be of infinite size. The performance is also enhanced since the length of the string (all but the final 4 bits) can be delivered to the output buffer as the string match is incrementing.

The LENRDY indicates when a length is ready. The LEN8BIT output indicates length is 8-bit length. The LEN2BIT output indicates the length is 2 bits.

The offset cannot be guaranteed to resolve to one and only one string match until half way through CAM 171 (1024 bytes). Length counter 194 must therefore be able to hold a count up to 1024 until the offset is resolved (OFFRDY is asserted). Once the offset is resolved the length function will output 8 bits at a time until it decrements the stored length to less than a count of 16. Once the length is less than 16 and the offset is resolved, then the length function will output 4 bits at a time until the end of the string match.

A string length block 203 contains the total length of the input data stream in bytes. String length block 203 is used to address the next CAM location for writing the byte of data into CAM 171. String length block 203 is also used to generate the offset value since the CAM data is not shifting in this architecture. Sub block 199 receives the output from index 196 and output of the string length 203 and produces an eleven bit offset ([10:0]). A comparator 200 compares this value with the number "128" to produce an off7 bit signal that indicates when only a seven bit offset is to be used. The output data byte must be registered to ensure that the data output pipeline lines up with the matching pipeline.

In this implementation, any priority encoder function built into the CAM 171 cannot be used since one must keep track of all of the matches throughout the match algorithm pipeline.

Decompression data flow is almost the same as is set out in FIG. 8. However, the offset must be subtracted from the current string length to calculate the position within CAM 171.

For example, before compression, a data string is defined as per ANSI X3.241-1994 as the following 16 byte character string "A B A A A A A A C A B A B A B A". The hex string equivalent is "41 42 41 41 41 41 41 41 43 41 42 41 42 41 42 41".

The resulting compressed string is generated with a pipeline delay of 2 cycles as "20 90 88 38 1C 21 E2 5C 15 80".

When decompressing the compressed data, the input stream is parsed to strip the bytes and string tokens out of the stream. Each data token is converted to a byte by removing the leading zero. The byte is then provided directly to the output and loaded into the CAM. The string tokens are decoded and used to expand the data from the history buffer (CAM contents).

The expansion of the data is accomplished by applying the offset (minus one) as the address (A) to the CAM block.

The resulting data out (DO) is then loaded into CAM 71 and presented as an output byte. The process is continued until the length of the string token has been decremented to zero.

The offset remains constant as the length is decremented when extracting the string from the history buffer. The address equation must be updated for each expansion step to ensure that the new string length is taken into consideration thus the address (A) is incremented with each byte.

For example, when decompressing the value set out in FIG. 9, bit 141 is a "0" indicating that the next eight bits are uncompressed data. Next eight bits 142 are a data value "41" which is placed in CAM 171 and utilized as one byte of data out. The new value is placed in CAM 171 at an address A =0 (A=string length−(offset−1)=0−(1−1)). As a result, CAM 171 is storing the following hex value "41" (starting with location 0 in CAM 171). The string length is incremented to equal 1.

Bit 143 is a "0" indicating that the next eight bits are uncompressed data. Next eight bits 144 are a data value "42" which is placed in CAM 171 and utilized as one byte of data out. The new value is placed in CAM 171 at an address A=1 (A=string length−(offset−1)=1−(1−1)). As a result, CAM 171 is storing the following hex values "41 42" (starting with location 0 in CAM 171). String length is incremented to equal 2.

Bit 145 is a "0" indicating that the next eight bits are uncompressed data. Next eight bits 146 are a data value "41" which is placed in CAM 171 and utilized as one byte of data out. The new value is placed in CAM 171 at an address A=2 (A=string length−(offset−1)=2−0). As a result, CAM 171 is storing the following hex values "41 42 41" (starting with location 0 in CAM 171). String length is incremented to equal 3.

Two-bit string 147 indicates that a string offset and length follow. Since the value of the two bits are "11" this indicates that the offset is described in seven bits (i.e., has a value less than or equal to 127). If the offset had been greater than 127, eleven bits would have been used and the value of two-bit string 147 would have been "10".

Seven bit offset 148 indicates the offset is equal to "1". String length, minus offset minus 1 (OFFSET−1) is placed on the address (A[10:0]) input of CAM 171. Four bit length 149 is divided into two two-bit sections. The first two bit section has a bit value of "11" which equals 3. The second two bit section has a bit value of "00" which equals 0. The total length of the string is therefore 2+3+0=5.

In the first clock cycle, the address of 0 (OFFSET−1) results in the value "41" being output from CAM 171. This value is utilized as the one byte of data out (DO[7:0]) and placed back in CAM 171. The new value is placed in CAM 171 at an address A=3 (A=string length−(offset−1)=3−0). As a result, CAM 171 is storing the following hex values "41 42 41 41" (starting with location 0 in CAM 171). The length is decremented to 4. The string length is incremented to equal 4.

In the next clock cycle, the address of 0 (OFFSET−1) results in the value "41" being output from CAM 171. This value is utilized as the one byte of data out (DO[7:0]) and placed back in CAM 171. The new value is placed in CAM 171 at an address A=4. As a result, CAM 171 is storing the following hex values "41 42 41 41 41". The length is decremented to 3. The string length is incremented to equal 5.

In the next clock cycle, the address of 0 (OFFSET−1) results in the value "41" being output from CAM 171. This value is utilized as the one byte of data out (DO[7:0]) and placed back in CAM 171. The new value is placed in CAM 171 at an address A=5. As a result, CAM 171 is storing the following hex values "41 42 41 41 41 41". The length is decremented to 2. The string length is incremented to equal 6.

In the next clock cycle, the address of 0 (OFFSET−1) results in the value "41" being output from CAM 171. This value is utilized as the one byte of data out (DO[7:0]) and placed back in CAM 171. The new value is placed in CAM 171 at an address A=6. As a result, CAM 171 is storing the following hex values "41 42 41 41 41 41 41". The length is decremented to 1. The string length is incremented to equal 7.

In the next clock cycle, the address of 0 (OFFSET−1) results in the value "41" being output from CAM 171. This value is utilized as the one byte of data out (DO[7:0]) and placed back in CAM 171. The new value is placed in CAM 171 at an address A=7. As a result, CAM 171 is storing the following hex values "41 42 41 41 41 41 41 41". The length is decremented to 0. The string length is incremented to equal 8.

Bit 150 is a "0" indicating that the next eight bits are uncompressed data. Next eight bits 151 are a data value "43" which is placed in CAM 171 and utilized as one byte of data out. The new value is placed in CAM 171 at an address A=8. As a result, CAM 171 is storing the following hex values "41 42 41 41 41 41 41 41 43". The string length is incremented to equal 9.

Two-bit string 152 indicates that a string offset and length follow. Since the value of the two bits are "11" this indicates that the offset is described in seven bits (i.e., has a value less than or equal to 127).

Seven bit offset 153 indicates the offset is equal to "9". This offset less 1 (OFFSET−1) is placed on the address (A[10:0]) input of CAM 171. Two bit length 151 has a bit value of "01" which equals 1. The total length of the string is therefore 2+1=3.

In the first clock cycle, the address of 8 (OFFSET−1) results in the value "41" being output from CAM 171. This value is utilized as the one byte of data out (DO[7:0]) and placed back in CAM 171. The new value is placed in CAM 171 at an address A=9. As a result, CAM 171 is storing the following hex values "41 42 41 41 41 41 41 41 43 41". The length is decremented to 2. The string length is incremented to equal 10.

In the next clock cycle, the address of 8 (OFFSET−1) results in the value "42" being output from CAM 171. This value is utilized as the one byte of data out (DO[7:0]) and placed back in CAM 171. The new value is placed in CAM 171 at an address A=10. As a result, CAM 171 is storing the following hex values "41 42 41 41 41 41 41 41 43 41 42". The length is decremented to 1. The string length is incremented to equal 11.

In the next clock cycle, the address of 8 (OFFSET−1) results in the value "41" being output from CAM 171. This value is utilized as the one byte of data out (DO[7:0]) and placed back in CAM 171. The new value is placed in CAM 171 at an address A=11. As a result, CAM 171 is storing the following hex values "41 42 41 41 41 41 41 41 43 41 42 41". The length is decremented to 0. The string length is incremented to equal 12.

Two-bit string 155 indicates that a string offset and length follow. Since the value of the two bits are "11" this indicates that the offset is described in seven bits (i.e., has a value less than or equal to 127).

Seven bit offset 156 indicates the offset is equal to "2". This offset less 1 (OFFSET−1) is placed on the address (A[10:0]) input of CAM 171. A two bit length 157 has a bit value of "10" which equals 2. The total length of the string is therefore 2+2=4.

In the first clock cycle, the address of 1 (OFFSET−1) results in the value "42" being output from CAM 171. This value is utilized as the one byte of data out (DO[7:0]) and placed back in CAM 171. The new value is placed in CAM 171 at an address A=12. As a result, CAM 171 is storing the following hex values "41 42 41 41 41 41 41 41 43 41 42 41 42". The length is decremented to 3. The string length is incremented to equal 13.

In the next clock cycle, the address of 1 (OFFSET−1) results in the value "41" being output from CAM 171. This value is utilized as the one byte of data out (DO[7:0]) and placed back in CAM 171. The new value is placed in CAM 171 at an address A=13. As a result, CAM 171 is storing the following hex values "41 42 41 41 41 41 41 41 43 41 42 41 42 41". The length is decremented to 2. The string length is incremented to equal 14.

In the next clock cycle, the address of 1 (OFFSET−1) results in the value "42" being output from CAM 171. This value is utilized as the one byte of data out (DO[7:0]) and placed back in CAM 171. The new value is placed in CAM 171 at an address A=11. As a result, CAM 171 is storing the following hex values "41 42 41 41 41 41 41 41 43 41 42 41 42 41 42". The length is decremented to 1. The string length is incremented to equal 15.

In the next clock cycle, the address of 1 (OFFSET−1) results in the value "41" being output from CAM 171. This value is utilized as the one byte of data out (DO[7:0]) and placed back in CAM 171. The new value is placed in CAM 171 at an address A=15. As a result, CAM 171 is storing the following hex values "41 42 41 41 41 41 41 41 43 41 42 41 42 41 42 41". The length is decremented to 0. The string length is incremented to equal 16.

Eight bit string 158 is an end marker indicating the end of the data stream.

The non-windowed architecture in FIGS. 10 and 11 has a nice feature of not requiring any more memory than CAM 171 for uncompressed data. Therefore, in a variation of the architecture shown in FIGS. 10 and 11, the data can be completely loaded into the CAM 171 prior to compression. The data can be bursted into CAM 171 prior to compression of the stream of data (freeing up bus bandwidth). As the data is compressed, the output stream is returned in the normal throttled manner.

Decompression is the opposite functions from compression. The input stream is feed into the block in a throttled manner while the output is collected in the CAM 171. The uncompressed data can then be bursted out of the CAM 171.

The larger amount of data (uncompressed) in both cases is transferred as a burst packet. The compressed stream in both cases is throttled to the input. Thus the overall required bus bandwidth and demand is reduced.

The data structures and matching algorithms remain the same for in-place compression, as described using FIGS. 10 and 11. After the data is loaded completely into CAM 171, each byte is tagged one at a time as valid for comparison by updating the valid flag. This mechanism requires that the valid flag be separately accessible from the input data (otherwise a read/modify/write operation is required). A simple depth (string length) counter is used to mask comparisons for bytes that are not yet to be considered a part of the history buffer if the valid bit is inaccessible.

The above described variation to the architecture shown in FIGS. 10 and 11, would be less advantageous as a variation of the architecture shown and described in conjunction with FIGS. 3 through 6, since that architecture takes advantage of the data moving through CAM 71 and the sliding window.

The content addressable memories described above require customized blocks for high performance/density implementations. The utilization of static RAM for the history buffer in combination with an external comparison can still yield acceptable performance with the advantage of a compact non-custom solution. This type of "CAM" implementation can be quite efficient especially for small packets.

The in-place algorithm for compression can be implemented very easily by tracking the number of bytes that are valid in a string length counter. The use of a string length counter removes the requirement for storing valid bits in the memory (reduction of size) as the validity of each byte is determined by the depth of the string length. The length counter is also used to determine how deep in the memory must be accessed for each pass of the algorithm (process one byte per pass).

Since small packets start with a small number of accesses required and build exponentially toward the end of the packet, this method works well for non-windowed implementations. The performance can be increased by utilizing a wider memory (64 bits for example) to reduce the number of memory accesses (or clocks) per byte.

Decompression is handled as described above. There is no comparison operation required (only the memory space).

One problem with using static RAM to implement the history buffer is that the performance goes down quickly as the packet sizes increase. The major advantage is the use of standard memories as well as a gate efficient implementation.

The performance of a static RAM implementation can be significantly improved by processing more than one byte at a time during the comparison (multiple bytes per selection). The addition of parallel comparators allows the memory to work ahead by processing multiple match vectors (and consequently bytes) at the same time. The implementation becomes much more complicated and the same effect can be obtained by adding another read port to the memory or expanding the bit width of the memory.

The above described architectures can be used interchangeably to solve each of the compression algorithm problems. However, a standard CAM in a windowed environment requires the use of a circular queue buffer (to make it look like a FIFO) in order to track the start of the history buffer within the CAM as the data wrapped. A circular queue buffer makes the adjacent calculation extremely difficult (i.e., there is a need to multiplex the match lines to determine adjacent match). In a non-windowed architecture, the data never wraps around the CAM making it more efficient for this architecture.

The base equation that is used for tracking a string match is always the same:

CHAR(i)=MATCH(i) and Prev(MATCH(i-1)) and (Prev(CHAR(i-1)) or Prev(SEND BYTE))

SEND BYTE=NOT(ANY(CHAR) and ANY(MATCH))

Where Prev() is the value just after the register (flip-flop output).

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A first-in-first-out (FIFO) content addressable memory (CAM) comprising:
   an address input for receiving CAM address signals; and,
   a plurality of CAM cells tiled together, each CAM cell comprising:
      a cell address input, coupled to the address input, for receiving the CAM address signals,
      a data input for receiving data to be stored in the CAM cell,
      storage logic for storing the data received at the data input,
      a data output for presenting as output the data stored in the storage logic, and
      match logic for comparing the data stored in the CAM cell with the CAM address signals, the match logic producing a match signal that indicates when the data stored in the CAM cell matches the CAM address signals;
   wherein the CAM cells are tiled together by connecting the data output for one CAM cell to the data input for another CAM cell.

2. A FIFO CAM as in claim 1 wherein the storage units are implemented using a plurality of flip-flops.

3. A FIFO CAM as in claim 1, wherein the match logic comprises:
   a plurality of logic XNOR gates, each XNOR gate receiving as input a bit of the data stored in the CAM cell, and a bit of the CAM address signals; and,
   a logic NAND gate for performing a logic NAND function on output from all of the plurality of logic XNOR gates.

4. A FIFO CAM as in claim 1 wherein each CAM cell additionally comprises:
   a validity input for receiving a validity bit that indicates whether the data to be stored in the CAM cell is valid;
   validity storage for storing the validity bit; and,
   validity output for presenting as output the validity bit stored in the validity storage.

5. Logic circuitry that performs a matching algorithm function, the logic circuitry comprising:
   a memory, the memory producing a match signal that indicates which memory cells contain data that matches input address data to the memory;
   a first logic AND function that performs a logic AND between a current value of the match signal currently produced by the memory for the input address data with a prior value of the match signal produced by an immediately prior input address data;
   a buffer for holding index data;
   a second logic AND function which compares output of the first logic AND function with the index data, output of the second logic AND function being returned to the buffer as new index data;
   index logic for generating an offset based on the index data stored in the buffer;
   a send byte function for asserting a send byte signal when the match signal is zero and when the output of the second logic AND function is zero; and,
   a length counter which is incremented for every cycle in which the send byte signal is not asserted.

6. Logic circuitry as in claim 5 wherein the memory is a first-in-first-out content addressable memory.

7. Logic circuitry as in claim 5 additionally comprising:
offset ready logic for generating an offset ready signal when the output of the second logic AND functions has only one bit set to logic one.

8. Logic circuitry as in claim 5 additionally comprising:
a first shift function for performing a one bit shift of the prior value before the prior value is received by the first logic AND function; and,
a second shift function for performing a one bit shift of the index data before the index data is received by the second logic AND function.

9. Logic circuitry as in claim 5 additionally comprising:
substitution logic for substituting all logic ones for the index logic as input to the second logic AND function on a cycle immediately after the send byte signal is asserted.

10. A method for providing first-in-first-out (FIFO) content addressable memory (CAM), the method comprising the following steps:
(a) applying CAM address signals to each of a plurality of CAM cells, the CAM cells being tiled together by connecting the data output for one CAM cell to the data input for another CAM cell; and,
(b) for each CAM cell in the plurality of CAM cells, performing the following substeps:
(b.1) receiving the CAM address signals,
(b.2) comparing data stored in the CAM cell with the CAM address signals and producing a match signal that indicates when the data stored in the CAM cell matches the CAM address signals,
(b.3) presenting as output the data stored in the CAM cell, and
(b.4) receiving new data to be stored in the CAM cell.

11. A method as in claim 10 wherein in substep (b.2), the data stored in the CAM cell are stored in a plurality of flip-flops.

12. A method as in claim 10 wherein in claim 1, substep (b.2) includes the following substeps:
performing a logic XNOR between each bit of the data stored in the CAM cell with an associated bit of the CAM address signals; and,
performing a logic NAND function on output from all results produced by the performance of the logic XNOR.

13. A method as in claim 10 wherein:
substep (b.3) includes presenting a validity bit that indicates whether the output data is valid; and,
substep (b.4) includes receiving a new validity bit along with the new data.

14. A method for performing a matching algorithm function, the method comprising the following steps:
(a) storing a plurality of data values in a memory;
(b) in response to input address data being used to address the memory, producing a match signal that indicates which memory cells contain data that matches the input address data;
(c) performing a logic AND between a current value of the match signal with a prior value of the match signal produced by an immediately prior input address data;
(d) performing a logic AND function to compare results of the logic AND performed in step (c) with an index data;
(e) storing results of the logic AND performed in step (c) as new index data;
(f) generating an offset based on the index data stored in step (e);
(g) asserting a send byte signal when the match signal produced in step (b) is zero and when the result of the logic AND performed in step (c) is zero; and,
(h) incrementing a length for every cycle in which the send byte signal is not asserted.

15. A method as in claim 14 wherein in step (a) the memory is a first-in-first-out content addressable memory.

16. A method as in claim 14 additionally comprising the following step:
(i) generating an offset ready signal when performing the logic AND in step (e) results in only one bit set to logic one.

17. A method as in claim 14 wherein:
step (c) includes performing a one bit shift of the prior value before performing the logic AND function; and,
step (d) includes performing a one bit shift of the index data before performing the logic AND functions.

18. A method as in claim 14 wherein step (d) includes substituting all logic ones for the index logic before performing the logic AND function on a cycle immediately after the send byte signal is asserted.

* * * * *